United States Patent
Kimura

(10) Patent No.: US 7,984,232 B2
(45) Date of Patent: Jul. 19, 2011

(54) MEMORY SYSTEM

(75) Inventor: Toshiro Kimura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 445 days.

(21) Appl. No.: 12/341,108

(22) Filed: Dec. 22, 2008

(65) Prior Publication Data

US 2009/0172266 A1 Jul. 2, 2009

(30) Foreign Application Priority Data

Dec. 27, 2007 (JP) ................................. 2007-338247

(51) Int. Cl.
*G06F 12/00* (2006.01)

(52) U.S. Cl. ....................................................... 711/103

(58) Field of Classification Search ........................ None
See application file for complete search history.

(56) References Cited

U.S. PATENT DOCUMENTS

2007/0136510 A1 6/2007 Ippongi
2008/0151618 A1 6/2008 Sharon et al.
2008/0205145 A1 8/2008 Kanno et al.
2008/0215798 A1 * 9/2008 Sharon et al. ................ 711/103

FOREIGN PATENT DOCUMENTS

JP 11-339495 12/1992
WO WO 2008/099958 A1 8/2008

OTHER PUBLICATIONS

U.S. Appl. No. 12/844,308, filed Jul. 27, 2010, Niwa.

* cited by examiner

*Primary Examiner* — Brian R Peugh
(74) *Attorney, Agent, or Firm* — Oblon, Spivak, McClelland, Maier & Neustadt, L.L.P.

(57) ABSTRACT

A memory system includes a NAND flash memory including a memory block containing a plurality of pages, and a controller which controls write of data to the flash memory, and includes a scrambling circuit which converts the data into a pseudo random number, wherein the scrambling circuit includes an initial value generator which generates an initial value for every segment, an initial value shifter which shifts the initial value by N bits for every page address, a pseudo random number generator which generates a pseudo random number sequence by an M-sequence by using the initial value shifted N bits, and a random number adder which adds the pseudo random number sequence to the data.

15 Claims, 16 Drawing Sheets

Scrambling method 1

| Pin No. | Signal |
|---|---|
| Pin 1 | Card detection/data 3 (DAT3) |
| Pin 2 | Command (CMD) |
| Pin 3 | Vss |
| Pin 4 | Vdd |
| Pin 5 | Clock (CLK) |
| Pin 6 | Vss |
| Pin 7 | Data 0 (DAT0) |
| Pin 8 | Data 1 (DAT1) |
| Pin 9 | Data 2 (DAT2) |

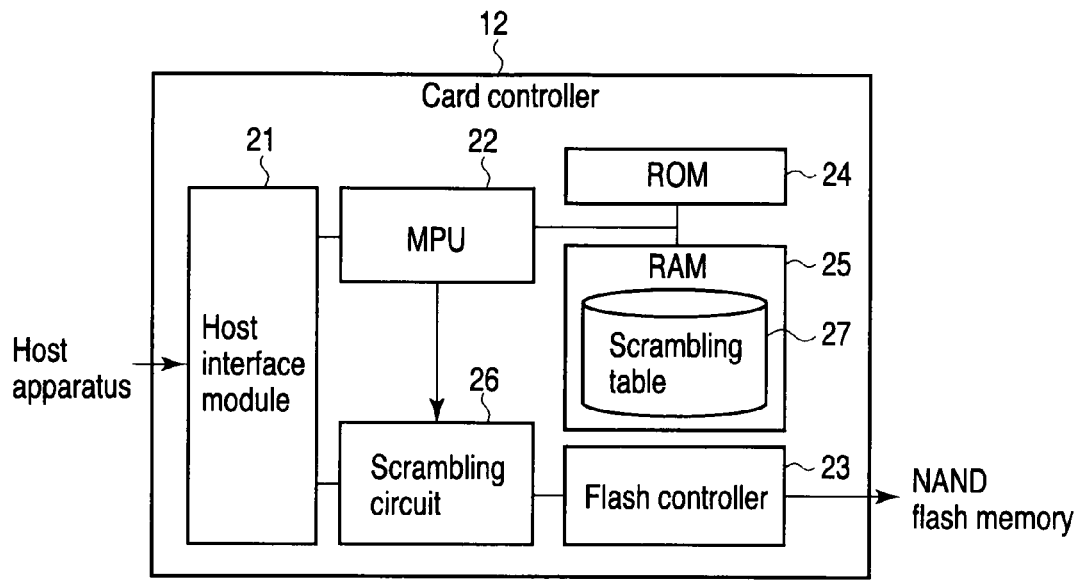
F I G. 3
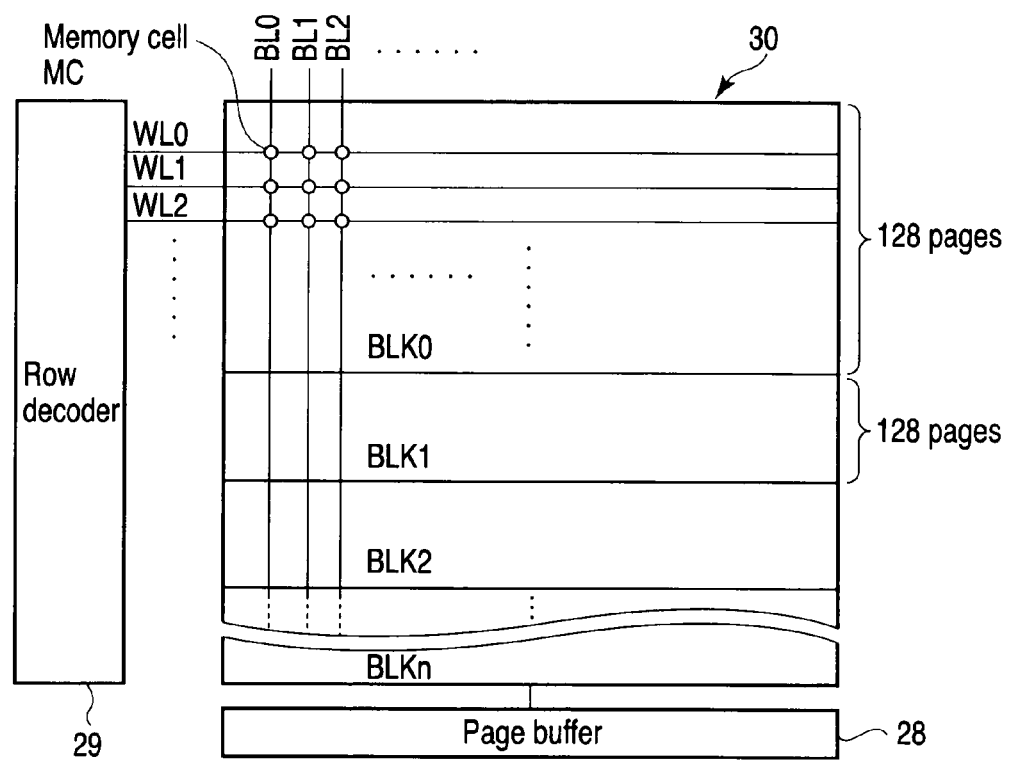
F I G. 4

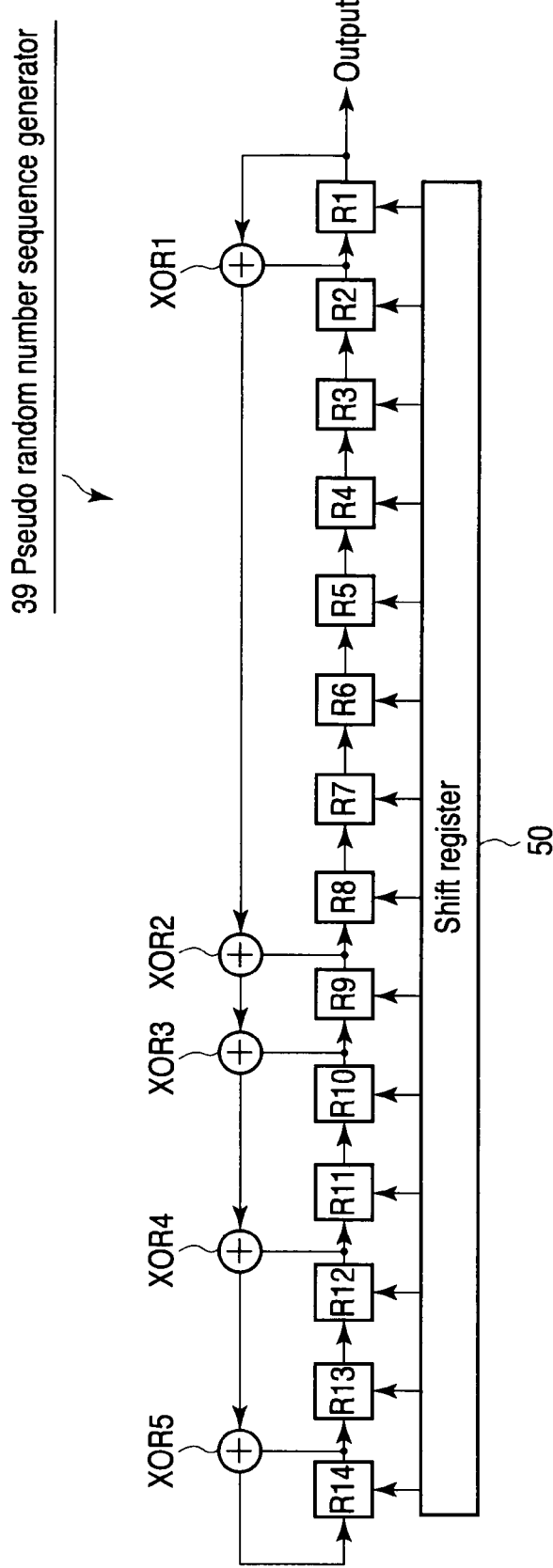
F I G. 12

Scrambling method 2 (page direction)      27 Scrambling table

| A | Upper page | Lower page |
|---|---|---|
| 0 | Do not invert | Do not invert |
| 1 | Invert | Do not invert |
| 2 | Do not invert | Invert |
| 3 | Invert | Invert |

FIG. 13

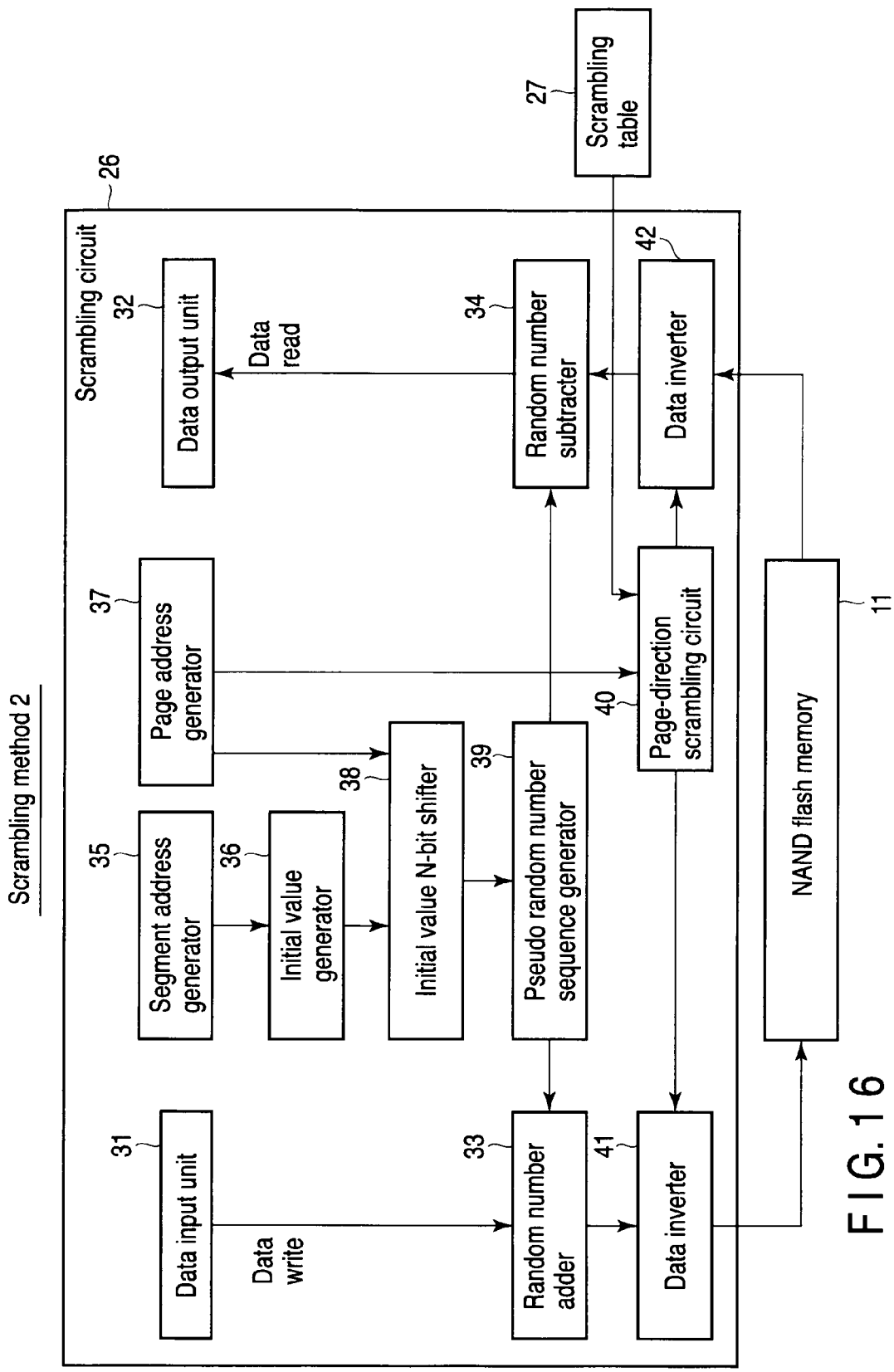
F I G. 16

MEMORY SYSTEM

CROSS-REFERENCE TO RELATED APPLICATIONS

This application is based upon and claims the benefit of priority from prior Japanese Patent Application No. 2007-338247, filed Dec. 27, 2007, the entire contents of which are incorporated herein by reference.

BACKGROUND OF THE INVENTION

1. Field of the Invention

The present invention relates to a memory system, e.g., a memory system that converts write data input to a NAND flash memory into a pseudo random number.

2. Description of the Related Art

Recently, demands for large-capacity nonvolatile semiconductor memories are increasing with the rapid spread of digital cameras, portable audio players, and the like, and NAND flash memories are widely used as the nonvolatile semiconductor memories. Recent micropatterning is increasing the capacities of the NAND flash memories, and this worsens the operation reliability.

As disclosed in, e.g., Jpn. Pat. Appln. KOKAI Publication No. 11-339495, therefore, a method of converting write data into a pseudo random number by using a random data generator using the M-sequence (Maximum length code) or the like is adopted. This method disperses data to be written into a block of a NAND flash memory, thereby preventing concentration of data patterns.

In the NAND flash memory, however, an unselected cell is made unselected for data write by using coupling (boost) of a word line and channel. When a certain specific pattern continues, therefore, insufficient boosting may cause a write error if cell threshold levels to be written in a block are biased. In a case like this, it is sometimes impossible to completely correct the error by an error check and correction (ECC) circuit. This makes it difficult to well secure the data reliability.

BRIEF SUMMARY OF THE INVENTION

A memory system according to an aspect of the present invention comprising a NAND flash memory including a memory block containing a plurality of pages; and a controller which controls write of data to the flash memory, and includes a scrambling circuit which converts the data into a pseudo random number, wherein the scrambling circuit includes an initial value generator which generates an initial value for every segment, an initial value shifter which shifts the initial value by N bits for every page address, a pseudo random number generator which generates a pseudo random number sequence by an M-sequence by using the initial value shifted N bits, and a random number adder which adds the pseudo random number sequence to the data.

BRIEF DESCRIPTION OF THE SEVERAL VIEWS OF THE DRAWING

FIG. 3 is a block diagram of a card controller of the memory card according to the embodiment of the present invention;

FIG. 4 is a block diagram of a flash memory according to the embodiment of the present invention;

FIG. 12 is a circuit diagram of a pseudo random number sequence generator of scrambling method 1 according to the embodiment of the present invention;

FIG. 13 is a conceptual view of a scrambling table used in scrambling method 2 (the page direction) according to the embodiment of the present invention;

FIG. 16 is a block diagram of a scrambling circuit of scrambling method 2 according to the embodiment of the present invention;

DETAILED DESCRIPTION OF THE INVENTION

Figures 1, 2:
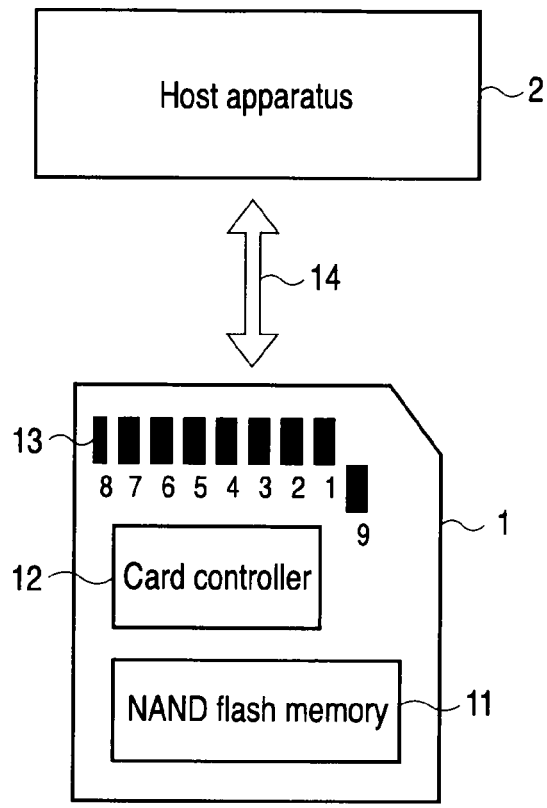
FIG. 1 is a block diagram of a memory system according to an embodiment of the present invention.
FIG. 2 is a view showing signal application to signal pins in a memory card according to the embodiment of the present invention.

An embodiment of the present invention will be explained below with reference to the accompanying drawing. Note that in the following explanation, the same reference numerals denote the same parts throughout the drawing.

[1] Configuration of Memory System

A memory system according to the embodiment of the present invention will be explained below with reference to FIG. 1. FIG. 1 is a block diagram of the memory system according to this embodiment.

As shown in FIG. 1, the memory system comprises a memory card 1 and host apparatus 2. The host apparatus 2 comprises hardware and software for accessing the memory card 1 connected via a bus interface 14. When connected to the host apparatus 2, the memory card 1 operates by receiving power supply, and performs processing corresponding to access from the host apparatus 2.

The memory card 1 exchanges information with the host apparatus 2 via the bus interface 14. The memory card 1 comprises a NAND flash memory chip (to be also simply referred to as a NAND flash memory or flash memory hereinafter) 11, a card controller 12 for controlling the NAND flash memory 11, and a plurality of signal pins (first to ninth pins) 13.

The plurality of signal pins 13 are electrically connected to the card controller 12. FIG. 2 shows an example of signal allocation to the first to ninth pins of the plurality of signal pins 13. FIG. 2 is a table showing the first to ninth pins, and signals allocated to these pins. As shown in FIG. 2, data 0, data 1, data 2, and data 3 are respectively allocated to the seventh, eighth, ninth, and first pins. The first pin is also allocated to a card detection signal. The second pin is allocated to a command. The third and sixth pins are allocated to a ground potential Vss. The fourth pin is allocated to a power supply potential Vdd. The fifth pin is allocated to a clock signal.

The memory card 1 can be inserted into a slot formed in the host apparatus 2. A host controller (not shown) of the host apparatus 2 communicates various signals and data with the card controller 12 in the memory card 1 via the first to ninth pins. When writing data in the memory card 1, for example, the host controller sends a write command as a serial signal to the card controller 12 via the second pin. The card controller 12 receives the write command input to the second pin in response to the clock signal supplied to the fifth pin.

As described above, the write command is serially input to the card controller 12 by using only the second pin. As shown in FIG. 2, the second pin allocated to command input is positioned between the first pin for data 3 and the third pin for the ground potential Vss. The host controller in the host apparatus 2 and the memory card 1 communicate with each other by using the plurality of signal pins 13 and the bus interface 14 corresponding to them.

By contrast, the flash memory 11 and card controller 12 communicate with each other by using a NAND flash memory interface. Although not shown, therefore, the flash memory 11 and card controller 12 are connected by, e.g., 8-bit input/output (I/O) lines.

When writing data in the flash memory 11, for example, the card controller 12 sequentially inputs a data input command 80H, column address, page address, data, and program command 10H to the flash memory 11 via these I/O lines. "H" of the command 80H indicates a hexadecimal number. In practice, 8-bit signals "10000000" are supplied parallel to the 8-bit I/O lines. That is, in this NAND flash memory interface, a plurality of bits of a command are supplied parallel.

Also, in the NAND flash memory interface, commands and data for the flash memory 11 are communicated by using the same I/O lines. Thus, the interface by which the host controller in the host apparatus 2 and the memory card 1 communicate with each other differs from the interface by which the flash memory 11 and card controller 12 communicate with each other.

[2] Arrangement of Card Controller

The internal arrangement of the card controller 12 shown in FIG. 1 will be explained below with reference to FIG. 3. FIG. 3 is a block diagram showing the card controller 12 according to this embodiment.

The card controller 12 manages the internal physical state (e.g., which physical block address contains what number of logical sector address data, or which block is in an erased state) of the flash memory 11. The card controller 12 controls data write and read of the NAND flash memory 11.

As shown in FIG. 3, the card controller 12 comprises a host interface module 21, MPU (Micro Processing Unit) 22, flash controller 23, ROM (Read-Only Memory) 24, RAM (Random Access Memory) 25, and scrambling circuit 26.

The host interface module 21 interfaces the card controller 12 with the host apparatus 2.

The MPU 22 controls the overall operation of the memory card 1. When the memory card 1 receives power supply, for example, the MPU 22 reads out firmware (a control program) stored in the ROM 24 onto the RAM 25 and executes predetermined processing, thereby forming various tables on the RAM 25. Also, the MPU 22 receives a write command, read command, or erase command, from the host apparatus 2, and executes predetermined processing on the flash memory 11. Furthermore, the MPU 22 scrambles write data by controlling the scrambling circuit 26. This write data scrambling will be described in detail later.

The ROM 24 stores, e.g., the control program to be controlled by the MPU 22. The RAM 25 is used as a work area of the MPU 22, and stores the control program and various tables. Furthermore, the RAM 25 holds a preformed scrambling table 27. Details of the scrambling table 27 will be described later. The flash controller 23 interfaces the card controller 12 with the flash memory 11.

[3] Arrangement of NAND Flash Memory

The internal arrangement of the NAND flash memory 11 will be briefly explained below with reference to FIG. 4. FIG. 4 is a block diagram of the NAND flash memory 11 according to this embodiment. As shown in FIG. 4, the NAND flash memory 11 comprises a memory cell array 30, page buffer 28, and row decoder 29.

The memory cell array 30 includes a plurality of memory blocks BLK0, BLK1, . . . Data is erased for every memory block BLKn. That is, data in the same memory block BLKn is erased at once. Each memory block BLKn comprises a plurality of memory cell transistors. Also, the memory block BLKn includes a plurality of word lines WL0, WL1, . . . , and a plurality of bit lines BL0, BL1, . . . perpendicular to the word lines WL0, WL1, . . . . The word lines WL0, WL1, . . . will be simply called word lines WL if it is not particularly necessary to distinguish between them. Likewise, the bit lines BL0, BL1, . . . will be simply called bit lines BL if it is not particularly necessary to distinguish between them. Memory cell transistors in the same row are connected together to the same word line. Memory cell transistors in the same column are connected together to the bit line BL for every plurality of memory cell transistors. Note that data write and read are performed for every group of a plurality of memory cell transistors connected to one word line WL. This memory cell transistor group will be called "one page". In a read or write operation, one word line WL is selected by the row address, and one bit line BL is selected by the column address. In the example shown in FIG. 4, each memory block BLKn of the flash memory 11 contains, e.g., 128 pages.

The page buffer 28 performs data input/output of the flash memory 11, and temporarily holds data. The data size that can be held by the page buffer 28 is the same as the page size of each memory block BLKn. When writing data, the page buffer 28 executes a data input/output process on the flash memory 11 for every page corresponding to the storage capacity of the page buffer 28. When reading out data, memory cell data of one page is transferred to the page buffer 28, and serially read out from it via the I/O line.

The row decoder 29 selects one word line WL in data write and read.

Figure 5:
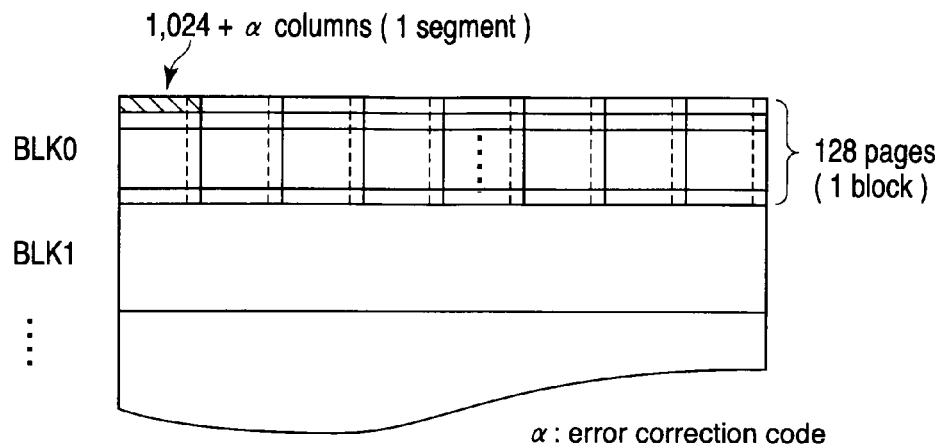
FIG. 5 is a detailed block diagram of the flash memory according to the embodiment of the present invention.

In this embodiment as shown in FIG. 5, one memory block BLKn comprises 8 k columns×128 pages×8 I/Os (1,024

Kbytes). One segment is formed by adding a redundant portion containing an error correction code α to 1,024 bytes. This segment is a memory management unit of the controller 12 and includes a data portion and the redundant portion. Since eight segments exist in one page, therefore, 1,024 (8×128) segments exist in one block. Note that FIG. 5 shows an example, and hence the present invention is not limited to this.

[4] Arrangement of Memory Block

Details of the arrangement of the memory block BLKn will be explained below with reference to FIG. 6.

Figure 6:
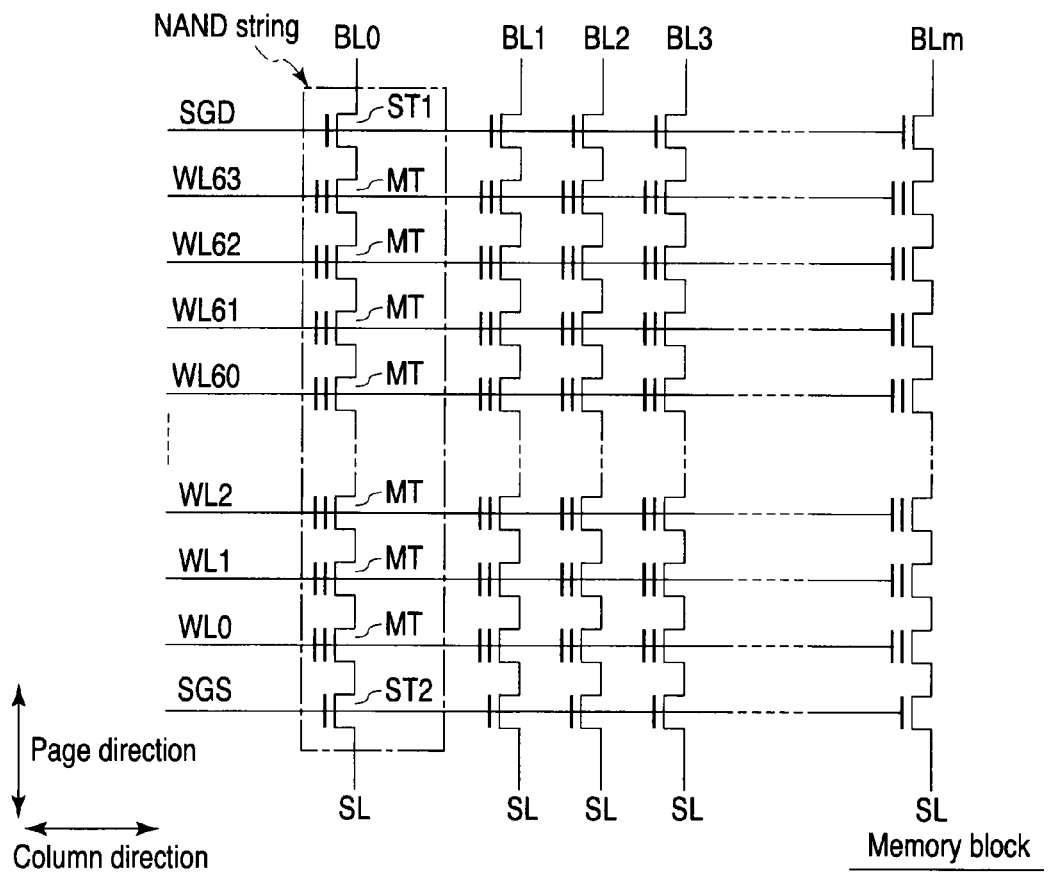
FIG. 6 is a circuit diagram of a memory block of the flash memory according to the embodiment of the present invention.

FIG. 6 is an equivalent circuit diagram of the memory block BLKn.

As shown in FIG. 6, the memory block BLKn has (m+1) (m is a natural number of 1 or more) NAND strings arranged along the direction of the word lines WL. Each NAND string includes selection transistors ST1 and ST2 and 64 memory cell transistors MT. The number of the memory cell transistors MT included in the NAND string is merely an example, and may also be, e.g., 8, 16, 32, or 128. The selection transistors ST1 included in the NAND strings have drains connected to bit lines BL0 to BLm, and gates connected together to a selection gate line SGD. The selection transistors ST2 have sources connected together to a source line SL, and gates connected together to a selection gate line SGS.

Each memory cell transistor MT is a MOS transistor having a stacked gate formed on a gate insulating film on a semiconductor substrate. The stacked gate includes a charge storage layer (floating gate) formed on the gate insulating film, and a control gate formed on an inter-gate insulating film on the charge storage layer. In each NAND string, the 64 memory cell transistors MT are arranged such that their current paths are connected in series between the source of the selection transistor ST1 and the drain of the selection transistor ST2. The control gates are connected to word lines WL0 to WL63 in order from the memory cell transistor MT positioned closest to the source side. Accordingly, the drain of the memory cell transistor MT connected to the word line WL63 is connected to the source of the selection transistor ST1, and the source of the memory cell transistor MT connected to the word line WL0 is connected to the drain of the selection transistor ST2.

The word lines WL0 to WL63 connect the control gates of the memory cell transistors MT together between the NAND strings in the memory block BLKn. That is, the control gates of the memory cell transistors MT in the same row in the memory block BLKn are connected to the same word line WL. Also, the bit lines BL0 to BLm connect the drains of the selection transistors ST1 together between the memory blocks BLKn. That is, the NAND strings in the same column in the plurality of memory blocks BLKn are connected to the same bit line BL.

Note that in the following description, the memory cell transistor MT will be simply called a memory cell MC in some cases.

Each memory cell MC described above can hold quaternary data (data "00", data "01", data "10", or data "11"), i.e., 2-bit data. Two different page addresses are allocated to these two bits. More specifically, a lower page address is allocated to the lower bit of the 2-bit data, and an upper page address is allocated to the upper bit. Accordingly, in the arrangement according to this embodiment in which the memory block BLKn contains 128 pages, 64 upper pages and 64 lower pages exist.

Figure 7:
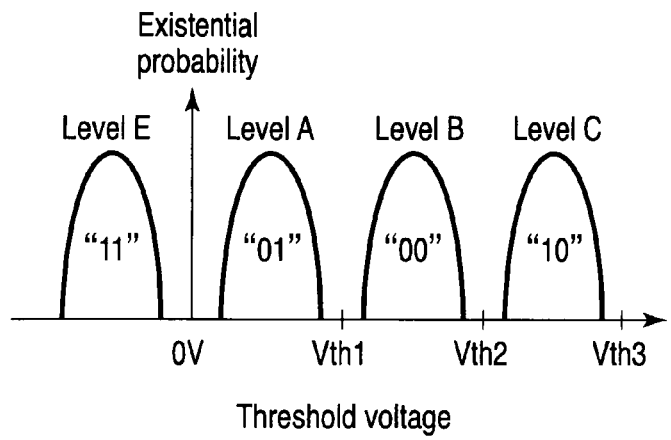
FIG. 7 is a graph showing the threshold distributions of the flash memory according to the embodiment of the present invention.

The threshold value of the above-mentioned memory cell MC will be explained below with reference to FIG. 7. FIG. 7 is a graph showing the threshold distributions of the memory cell MC. In FIG. 7, the abscissa indicates a threshold voltage Vth, and the ordinate indicates the existential probability of a memory cell.

As shown in FIG. 7, the memory cell MC can hold four data "11", "01", "00", and "10" in ascending order of the threshold voltage Vth. The threshold voltage Vth of a memory cell holding data "11" is Vth<0 V. The threshold voltage Vth of a memory cell holding data "01" is 0V<Vth<Vth1. The threshold voltage Vth of a memory cell holding data "00" is Vth1<Vth<Vth2. The threshold voltage Vth of a memory cell holding data "10" is Vth2<Vth<Vth3.

Figure 8:
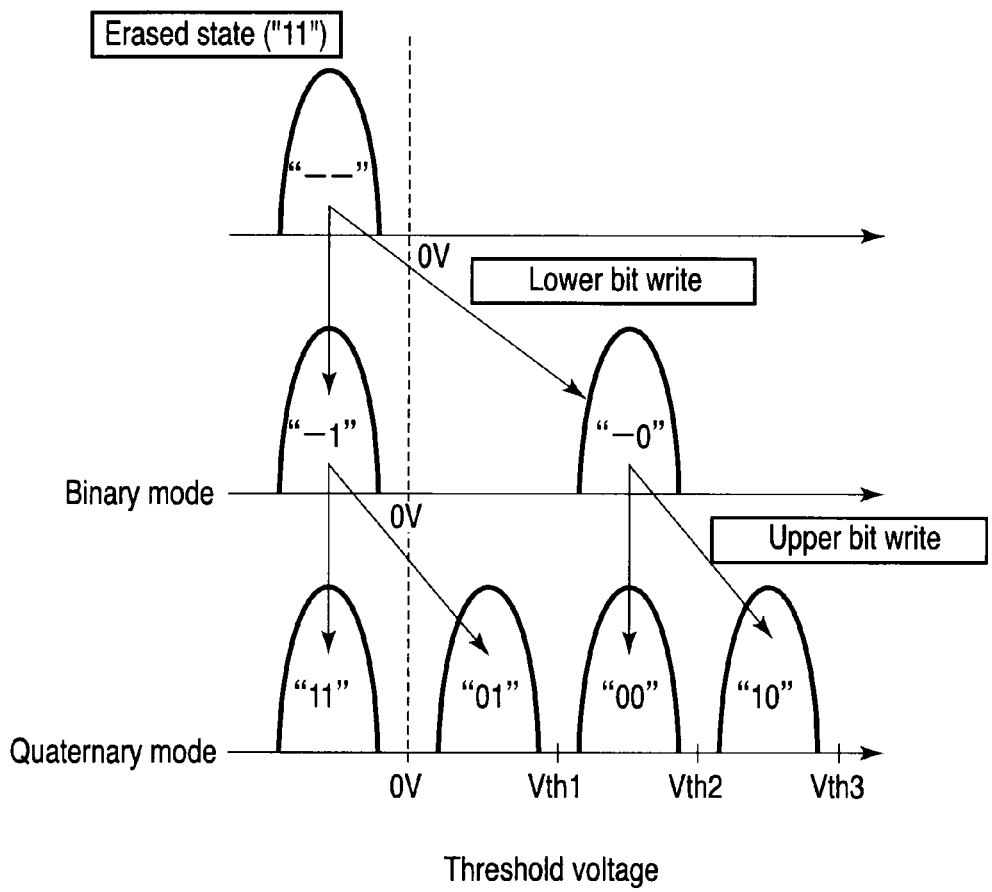
FIG. 8 is a graph showing the threshold distributions of the flash memory according to the embodiment of the present invention, in which a data write method is illustrated.

A method of writing the above-mentioned quaternary data in the memory cell MC will be briefly explained below with reference to FIG. 8. FIG. 8 is a graph showing the threshold distributions of the memory cell, in which the way the threshold voltage Vth of the memory cell changes during data write is illustrated. Data is written in one page at once. Also, data write is performed from the lower page to the upper page.

When writing data, the memory cell is in an erased state. That is, the threshold voltage Vth of the memory cell has a negative value, and the memory cell is holding data "11". In this state, data of the lower page is written first. If the lower page is "1", no electrons are injected into the floating gate, so the threshold voltage Vth remains unchanged. If the lower page is "0", electrons are injected into the floating gate, and the threshold voltage Vth changes in the positive direction such that approximately Vth1<Vth<Vth2 holds.

Then, the upper page is written. First, the case where the lower page is "1" will be explained. If the lower page is "1" and the upper page is also "1", no electrons are injected into the floating gate even when writing the upper page, so the threshold voltage Vth maintains the negative value. As a consequence, "11" is held in the memory cell. If the upper page is "0", electrons are injected into the floating gate. Consequently, the threshold voltage Vth changes from negative to positive such that 0V<Vth<Vth1 holds. That is, "01" is written in the memory cell.

The case where the lower page is "0" will now be explained. If the lower page is "0" and the upper page is "0", no electrons are injected into the floating gate when writing the upper page. Accordingly, the value of the result of lower page write is maintained. That is, Vth1<Vth<Vth2 holds, and as a consequence "00" is held in the memory cell. If the upper page is "1", electrons are further injected into the floating gate. Consequently, the threshold voltage Vth further changes in the positive direction such that Vth2<Vth<Vth3 holds. That is, "10" is written in the memory cell.

[5] Data Scrambling

In the write operation of this embodiment, data scrambling (pseudo random number generation) is performed in both the column and page directions. Note that in this embodiment, the column direction is the direction in which the word lines run, and the page direction is the direction in which the bit lines and NAND strings run (FIG. 6).

[5-1] Scrambling Method 1

Scrambling method 1 according to this embodiment generates a pseudo random number circuit initial value shifted N bits for every page address in the page direction, and generates a pseudo random number sequence for every segment by using an M-sequence random number in the column direction by using the initial value data, thereby performing data scrambling in both the page and column directions.

Figure 9:
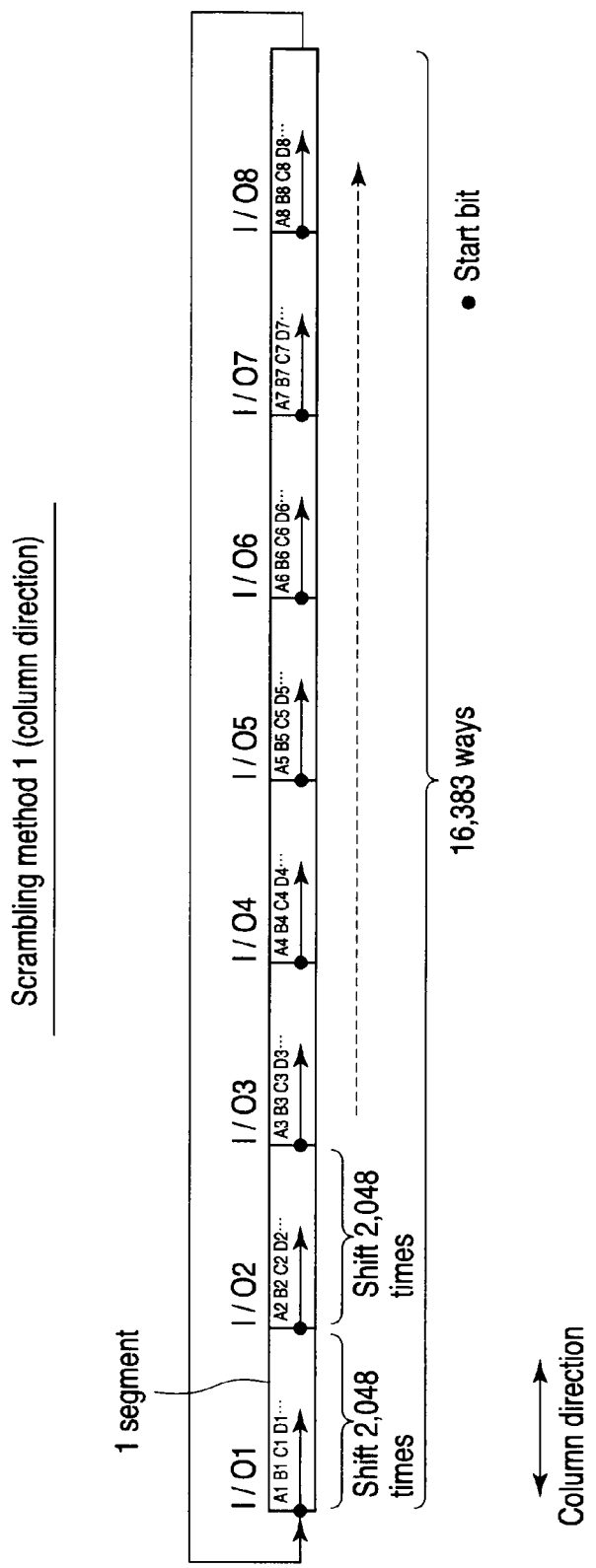
FIG. 9 is a view for explaining scrambling method 1 (the column direction) according to the embodiment of the present invention.

Data scrambling performed using the M-sequence random number in the column direction will be explained below with reference to FIG. 9. In each segment, a value shifted a number of times calculated by dividing the M-sequence random number generation period by the number of I/Os is given as an initial value (start bit). For example, when using a random number generator using an M sequence (16,383 ways) of $M^{14}-1$, a value shifted 2,048 times is given as an initial value to each segment with respect to the eight I/Os of the NAND flash memory.

Note that in the above example, the number of times of shift is evenly defined for each I/O. However, the present invention is not limited to this, and the number of times of shift may also change from one I/O to another.

Figure 10:
FIG. 10 is a view for explaining scrambling method 1 (the page direction) according to the embodiment of the present invention.

Data scrambling in the page direction will be explained below with reference to FIG. 10. For example, the initial value of each I/O is shifted N times in the page direction. In an example of 1-bit shift shown in FIG. 10, while Page-0 starts from "A1", Page-1 starts from "B1" shifted one bit from the initial value A1 of Page-0, and Page-2 starts from "C1" shifted one bit from the initial value B1 of Page-1.

An outline of the arrangement of the scrambling circuit 26 for implementing scrambling method 1 described above will be explained below.

Figure 11:
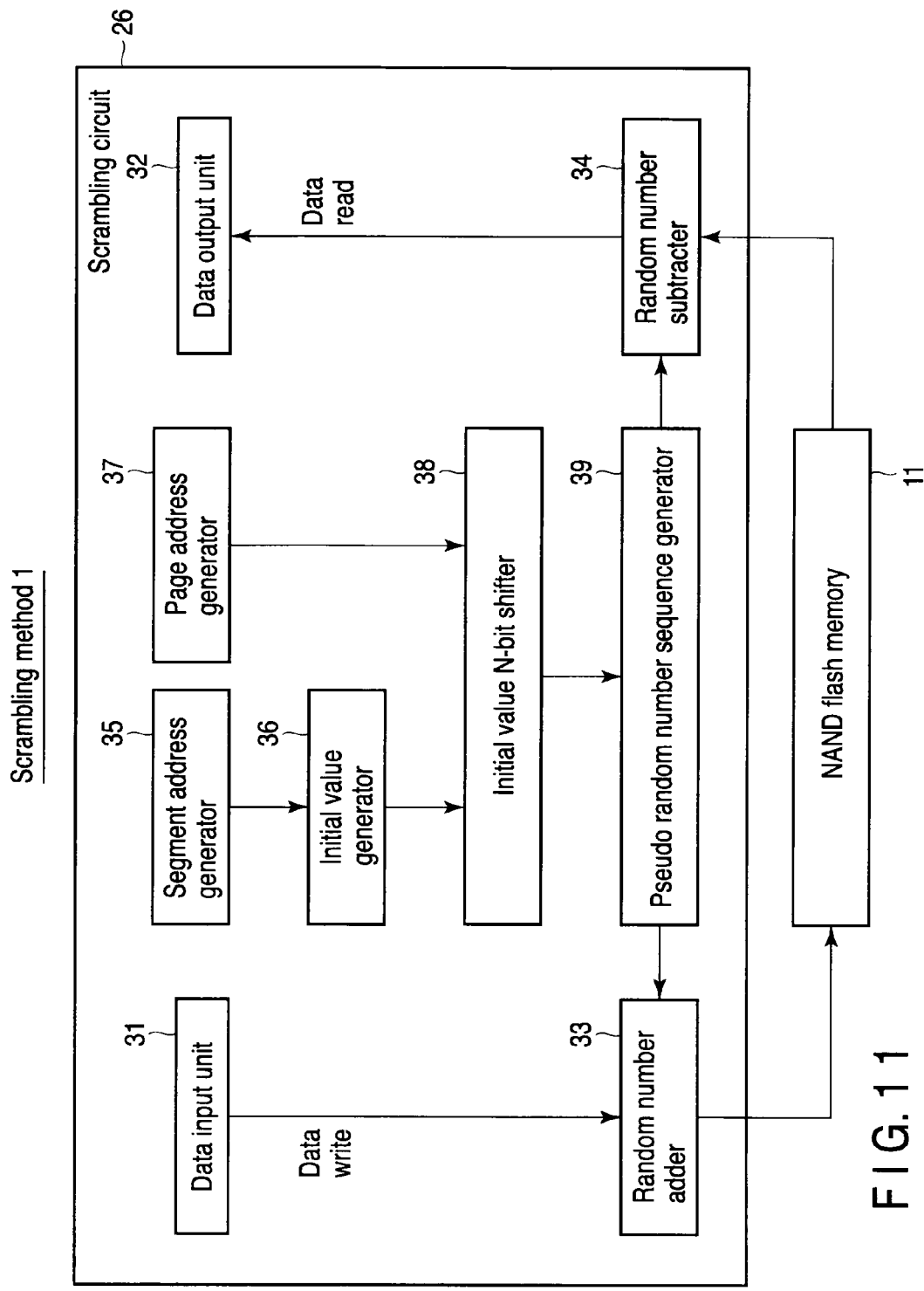
FIG. 11 is a block diagram of a scrambling circuit of scrambling method 1 according to the embodiment of the present invention.

As shown in FIG. 11, the scrambling circuit 26 of scrambling method 1 comprises a data input unit 31, data output unit 32, random number adder 33, random number subtractor 34, segment address generator 35, initial value generator 36, page address generator 37, initial value N-bit shifter 38, and pseudo random number sequence generator 39.

Data is written by using the scrambling circuit 26 as follows.

First, the host apparatus 2 supplies a data write instruction and write data to the memory card 1, and the host interface module 21 of the card controller 12 receives the write instruction and write data.

Then, the MPU 22 calculates the segment address and page address of the memory cell MC in which the received write data is to be written. On the basis of the calculation results, the segment address generator 35 and page address generator 37 in the scrambling circuit 26 respectively generate the segment address and page address.

On the other hand, the write data received by the host interface module 21 is input to the data input unit 31, and the random number adder 33 adds the write data and a pseudo random number sequence. The data in the form of a random number is written page by page in the NAND flash memory 11.

The pseudo random number sequence is generated by the pseudo random number sequence generator 39 as follows. The initial value generator 36 generates an initial value (start bit) for every segment. The segment initial value is determined by randomization in the column direction of scrambling method 1 shown in FIG. 9. Subsequently, as explained above with reference to FIG. 10, the initial value N-bit shifter 38 shifts the initial value by N bits for every page address. The pseudo random number sequence generator 39 generates the randomized pseudo random number sequence in both the column and page directions by the method as described above.

Note that when reading out data, the random number subtractor 34 performs subtraction by using the same random number sequence as the pseudo random number sequence used in the random number adder 33, thereby reading out the data page by page via the data output unit 32.

An example of the pseudo random number generator 39 shown in FIG. 11 will be explained below with reference to FIG. 12. A Fibonacci pseudo random number sequence generator 39 generates pseudo random number data at a column address period of 1 k+α, and exclusively ORs this data and data to be written in the NAND flash memory 11. More specifically, as shown in FIG. 12, the pseudo random number generator 39 comprises first shift registers R1 to R14, a second shift register 50, and exclusive OR gates XOR1 to XOR5.

The first shift registers R1 to R14 are connected in series. The input terminals of the first shift registers R2, R3, R4, R5, R6, R7, R10, and R12 are respectively connected to the output terminals of the first shift registers R3, R4, R5, R6, R7, R8, R11, and R13 in the input stages. The output terminal of the first shift register R1 is connected to the exclusive OR gate XOR1, and the exclusive OR gate XOR1 is connected to the input terminal of the first shift register R1. The output terminal of the exclusive OR gate XOR1 is connected to the input terminal of the exclusive OR gate XOR2, and the exclusive OR gate XOR2 is connected to the input terminal of the first shift register R8. The output terminal of the exclusive OR gate XOR2 is connected to the input terminal of the exclusive OR gate XOR3, and the exclusive OR gate XOR3 is connected to the input terminal of the first shift register R9. The output terminal of the exclusive OR gate XOR3 is connected to the input terminal of the exclusive OR gate XOR4, and the exclusive OR gate XOR4 is connected to the input terminal of the first shift register R11. The output terminal of the exclusive OR gate XOR4 is connected to the input terminal of the exclusive OR gate XOR5, and the exclusive OR gate XOR5 is connected to the input terminal of the first shift register R13. The output terminal of the exclusive OR gate XOR5 is connected to the input terminal of the first shift register R14.

The output terminals of the shift register 50 are connected to the first shift registers R1 to R14 as described above.

Note that the first shift registers R1 to R14 are used in data scrambling in the column direction, and the shift register 50 is used in data scrambling in the page direction to generate the initial value of each page. The M-sequence pseudo random number generated by the pseudo random number sequence generator 39 is input to the random number adder 33 or random number subtractor 34.

[5-2] Scrambling Method 2

Scrambling method 2 is a modification of scrambling method 1 described above. In scrambling method 2, data is not only shifted N bits in the page direction, but also inverted or not inverted in accordance with the address (to be referred to as a word line address or page address hereinafter) of the word line WL. The differences of scrambling method 2 from scrambling method 1 will be mainly explained below together with the scrambling table 27 held in the RAM 25 shown in FIG. 3.

FIG. 13 is a conceptual view of the scrambling table 27 used in scrambling method 2. The scrambling table 27 holds scrambling schemes for changing externally input write data of one page in accordance with predetermined rules.

As shown in FIG. 13, the scrambling table 27 holds, for each remainder A as a result of the division of a word line address by, e.g., "4", methods of changing the upper and lower pages of data corresponding to the word line address. More specifically, if the remainder A as a result of the division of a word line address by "4" is "0", data to be written in the upper and lower pages are written without being inverted. That is, the input data is not changed but directly written in the memory cell MC. If the remainder A is "1", data to be written in the upper page is written after being inverted, and data to be written in the lower page is written without being inverted. If the remainder A is "2", the data to be written in the upper page is written without being inverted, and the data to be written in the lower page is written after being inverted. If the remainder A is "3", both the data to be written in the upper and lower pages are written after being inverted.

As described above, scrambling method 2 has the scrambling scheme for each remainder A as a result of the division of a word line address by "4". In other words, the word lines WL are classified into four groups, and the scrambling scheme is changed from one group to another.

Figure 14:
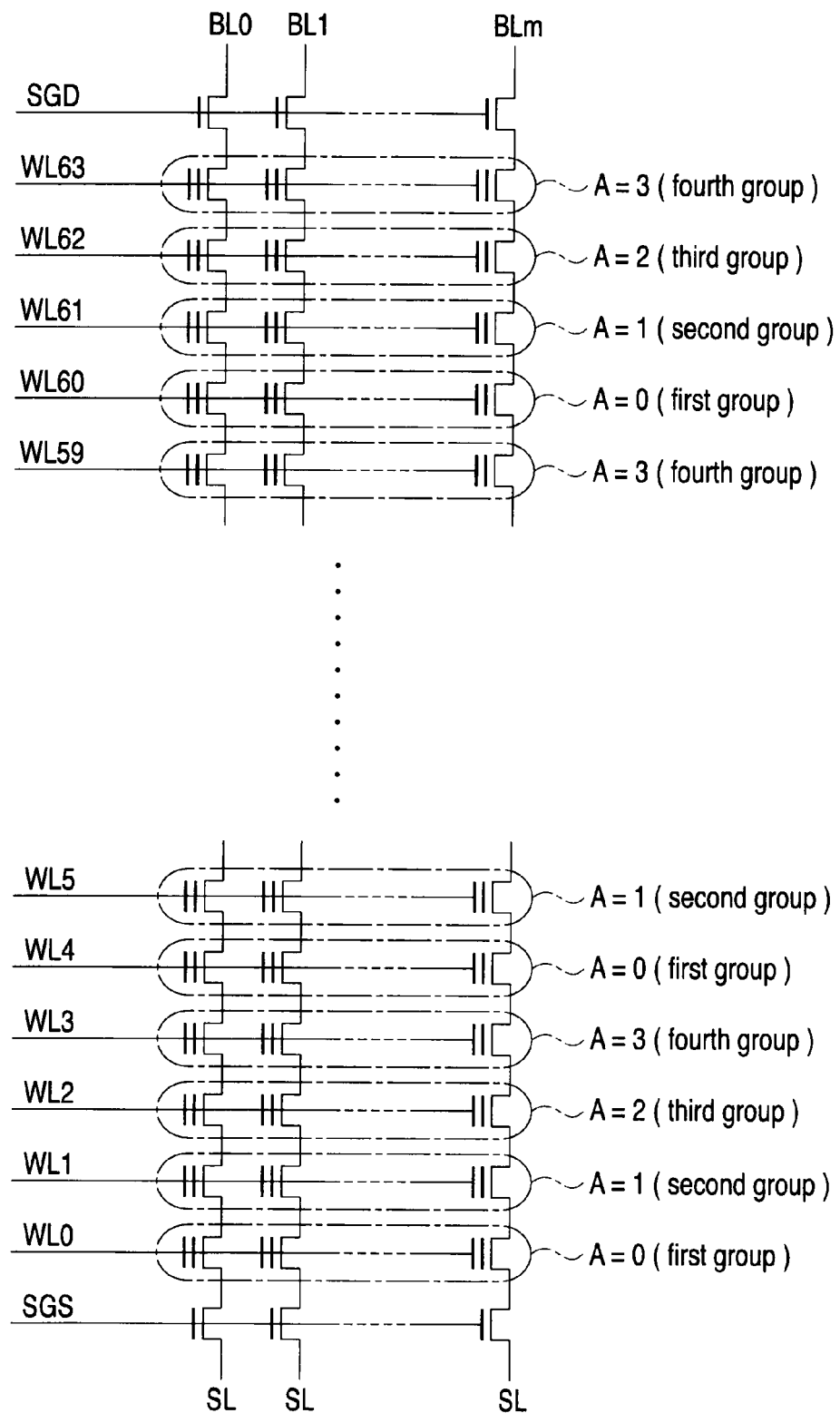
FIG. 14 is a circuit diagram of a memory block of the flash memory according to the embodiment of the present invention.

FIG. 14 shows the results of classification of the word lines WL into four groups performed by the above method. As shown in FIG. 14, assuming that the word line addresses of the word lines WL0 to WL63 are "0" to "63", the remainder A is "0" for the word lines WL0, WL4, WL8, ..., WL60, and these word lines WL are classified into a first group. The remainder A is "1" for the word lines WL1, WL5, WL9, ..., WL61, and these word lines WL are classified into a second group. The remainder A is "2" for the word lines WL2, WL6, WL10, ..., WL62, and these word lines WL are classified into a third group. The remainder A is "3" for the word lines WL3, WL7, WL11, ..., WL63, and these word lines WL are classified into a fourth group. After that, different scrambling schemes are adopted for the first to fourth groups. The scrambling circuit 26 scrambles externally input data in accordance with the above scrambling schemes.

Figure 15:
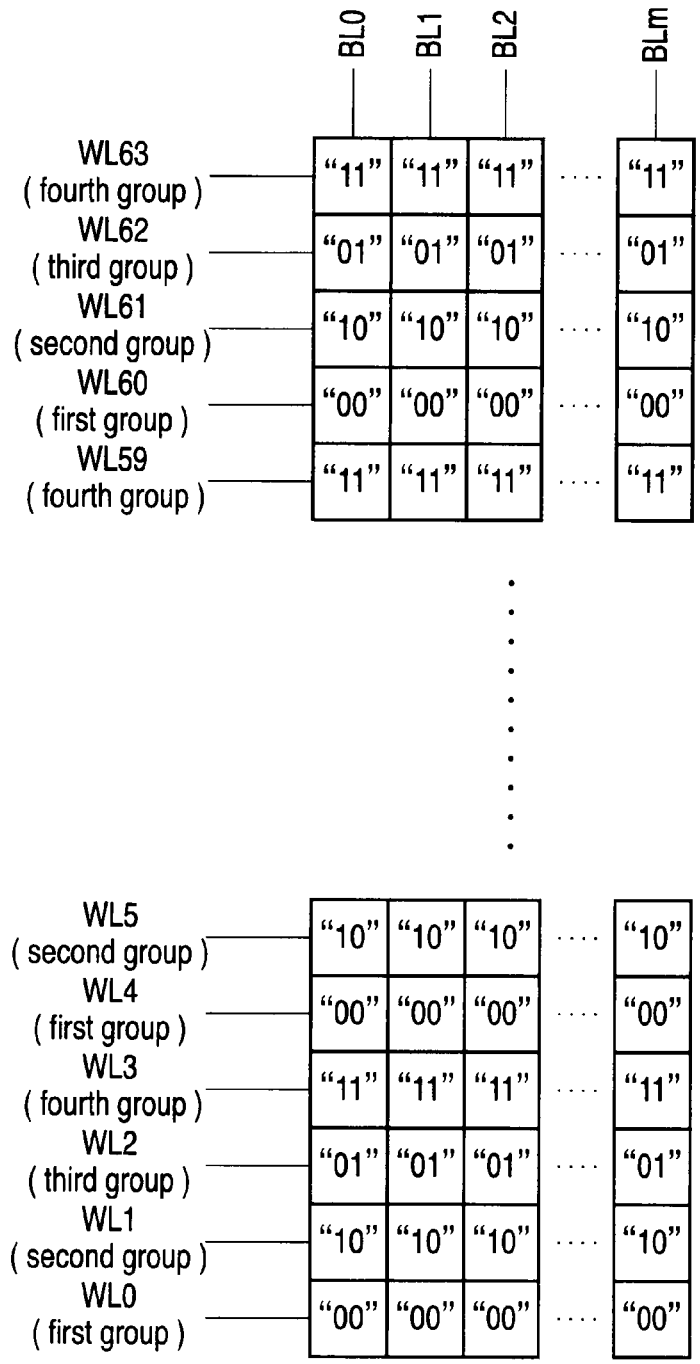
FIG. 15 is a conceptual view of the memory block of the flash memory according to the embodiment of the present invention, showing the way scrambled data is written in each memory cell.

A practical example of the use of the above scrambling table 27 will be explained below with reference to FIG. 15. FIG. 15 shows data actually written in the memory cells MC when writing "00" in all the memory cells MC.

As shown in FIG. 15, the input data "00" is directly written in the memory cells MC connected to the word lines WL0, WL4, WL8, ..., WL60 of the first group. Data "10" obtained by inverting the upper page is written in the memory cells MC connected to the word lines WL1, WL5, WL9, ..., WL61 of the second group. Data "01" obtained by inverting the lower page is written in the memory cells MC connected to the word lines WL2, WL6, WL10, ..., WL62 of the third group. Data "11" obtained by inverting both the upper and lower pages is written in the memory cells MC connected to the word lines WL3, WL7, WL11, ..., WL63 of the fourth group.

Next, an outline of the arrangement of the scrambling circuit 26 for implementing scrambling method 2 described above will be explained below with reference to FIG. 16. As shown in FIG. 16, the scrambling circuit 26 of scrambling method 2 further comprises a page-direction scrambling circuit 40 and data inverters 41 and 42 in addition to the scrambling circuit 26 of scrambling method 1 shown in FIG. 11.

Data is written by using the scrambling circuit 26 as follows. First, in the same manner as in scrambling method 1 described previously, the pseudo random number sequence generator 39 generates a pseudo random number sequence in both the column and page directions. The random number adder 33 adds write data and the pseudo random number sequences, thereby generating random-number data. In addition, in scrambling method 2, the page-direction scrambling circuit 40 performs data scrambling in the page direction by using the scrambling table 27 shown in FIG. 13, and the data inverter 41 inverts the random-number data.

More specifically, the MPU 22 determines, by using a page address (to be referred to as a word line address hereinafter) generated by the page address generator 37, which of the first to fourth groups the word line WL corresponding to this word line address belongs to. That is, letting M be the word line address and N be the number of groups (in this embodiment, N "4"), the MPU 22 performs a calculation indicated by A=M mod N. If the remainder A is "0", "1", "2", or "3", the word line corresponding to this word line address belongs to the first, second, third, or fourth group.

Then, the MPU 22 refers to the scrambling table 27 of FIG. 13 held in the RAM 25. The MPU 22 selects a scrambling scheme in accordance with the determined group. For example, if A="3" and it is determined that the word line corresponding to this word line address belongs to the fourth group, the MPU 22 selects the scrambling scheme that inverts both the upper and lower pages of the write data, and instructs the scrambling circuit 26 to use this scrambling scheme.

The page-direction scrambling circuit 40 and data inverter 41 in the scrambling circuit 26 scramble the write data in accordance with the scrambling scheme selected by the MPU 22. For example, when writing upper-page data of the word line WL of the fourth group, the whole page data is inverted.

Note that when reading out data, the data is read out from a memory cell in accordance with an externally input address, and the MPU 22 reads out a scrambling scheme corresponding to the address from the scrambling table 27. The MPU 22 then interprets the readout data in accordance with the readout scrambling scheme. For example, when reading out the lower-page data of a word line of the third group, the scrambling scheme is "Invert" as shown in FIG. 13, so the MPU 22 instructs the data inverter 42 to output the readout data outside after inverting it. To perform this read method, data can be copied page by page only between word lines of the same group.

[5-3] Scrambling Method 3

Scrambling method 3 determines a block to be scrambled, and performs data read or write without any data scrambling if the determined block is a specific block. A case using scrambling method 3 will be explained below.

For data (e.g., a FAT: File Allocation Table) requiring high reliability or the like, the system performs binary read or write on a multilevel NAND product in order to ensure the write/read margin by writing only one data ("1" or "0") in one cell. That is, even for a quaternary product, specific data is intentionally processed as binary data and written in or read out from a specific area (e.g., a first block). If this area is converted into a random number, the original object cannot be achieved because the area is necessarily converted into a quaternary area, except when the upper page is skipped. To prevent this, therefore, random number conversion of this specific block is inhibited. In other words, since the system regards a block to be processed as a binary block as a specific block, the block is controlled using the flag. That is, for a specific block to be processed as a binary block, read and write are performed directly without any random number addition or subtraction.

An outline of the arrangement of the scrambling circuit 26 for implementing read and write as described above will be explained below with reference to FIG. 17.

Figure 17:
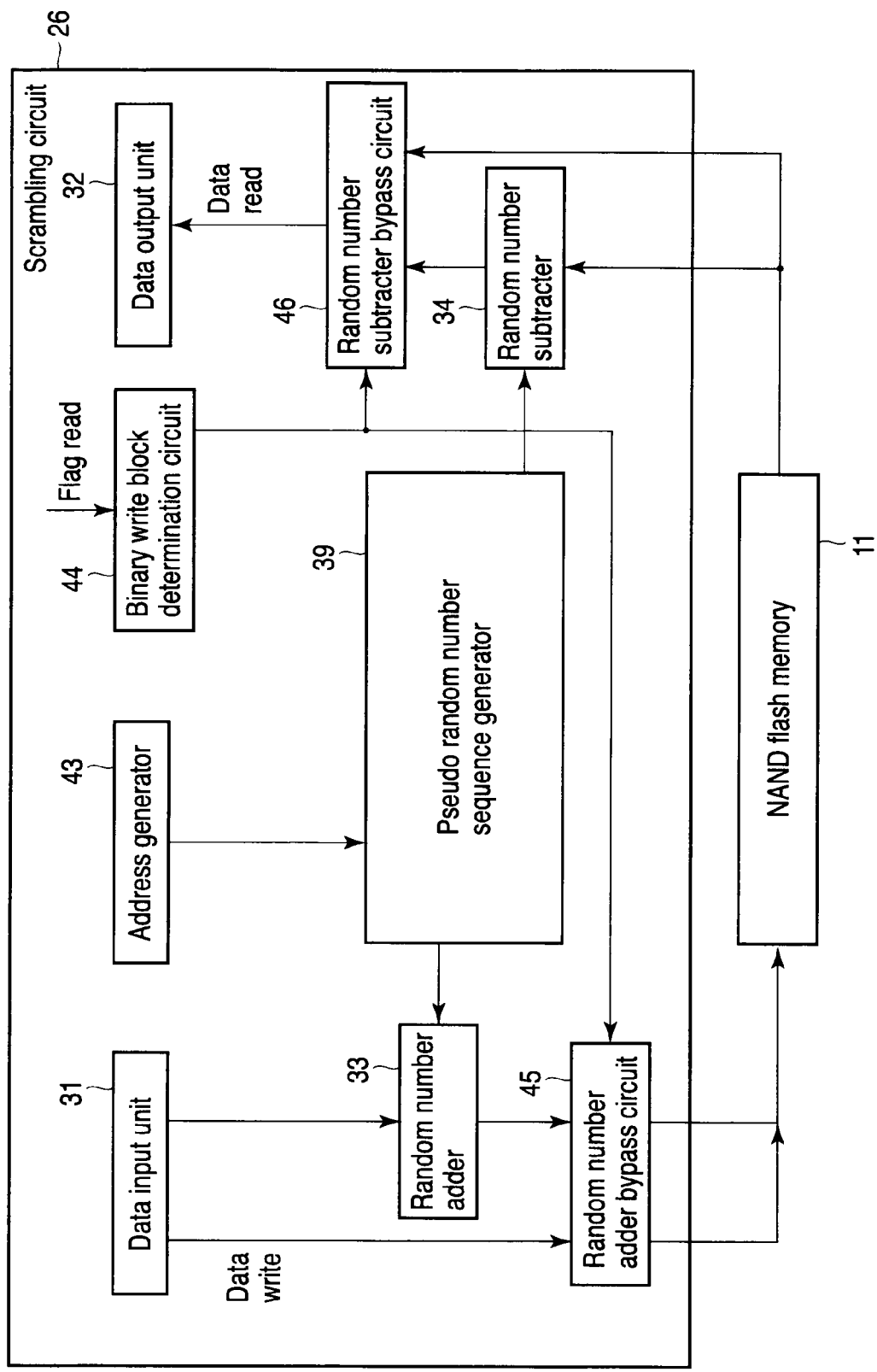
FIG. 17 is a block diagram of a scrambling circuit of scrambling method 3 according to the embodiment of the present invention.

As shown in FIG. 17, the scrambling circuit 26 comprises a data input unit 31, data output unit 32, random number adder 33, random number subtractor 34, pseudo random number sequence generator 39, address generator 43, binary write block determination circuit 44, random number adder bypass circuit 45, and random number subtractor bypass circuit 46.

The address generator 43 generates the address of write data. The address generator 43 may also comprise, e.g., the segment address generator 35, initial value generator 36, page address generator 37, and initial value N-bit shifter 38 shown in FIGS. 11 and 16.

The binary write block determination circuit 44 determines, by using a flag, whether the write data address designated by the address generator 43 is contained in a specific block to be processed as a binary block (to be referred to as a specific block hereinafter). If the address is contained in the specific block, the random number adder bypass circuit 45 directly writes the write data in the NAND flash memory 11 by bypassing the random number adder 33. Similarly, if the address of written data is contained in the specific block when reading out the data, the random number subtractor bypass circuit 46 directly reads out the data by bypassing the random number subtractor 34.

Note that scrambling method 3 may also be combined with one of scrambling methods 1 and 2 described previously.

Note also that in the scrambling methods of this embodiment, the number of bytes of one segment can be variously changed. It is also possible to generate a pseudo random number for every plurality of segments or pages.

[6] Effects

The embodiment of the present invention can prevent concentration of specific data patterns by dispersing data to be written in a block of the NAND flash memory 11 in the directions of both columns and pages forming the block, by using the pseudo random number sequence generator 39 using the M-sequence code generator and shift register. This makes it possible to uniformly disperse the cell threshold level distribution to be written in the block of the multilevel NAND flash memory 11. Accordingly, a write error caused by, e.g., insufficient boost resulting from the influence of coupling or the like can be prevented.

The results (normal plots) of simulation of analyzing data actually written in the 8-Gb NAND flash memory 11 by an application and checking the cell threshold level distributions in the block will be explained below with reference to FIGS. 8A to 8C and 9A and 9B. In each drawing, the abscissa indicates the number of cell threshold level distributions to be written in one block, and the ordinate indicates the sigma (the number of cell threshold levels are rearranged in descending order in all the analyzed blocks). Also, levels E, A, B, and C in each drawing respectively correspond to the threshold levels "11", "01", "10", and "00" in FIG. 7.

Figure 18A:
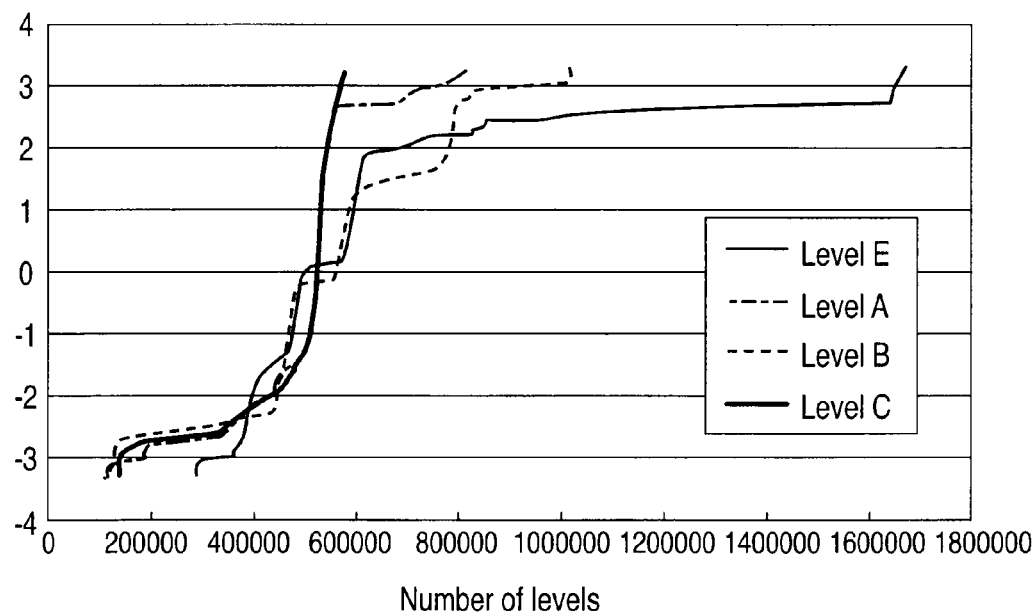
FIGS. 18A to 18C are graphs showing the results of simulation of the cell threshold level distributions of NAND flash memories of reference examples of the present invention.
Figure 18B:
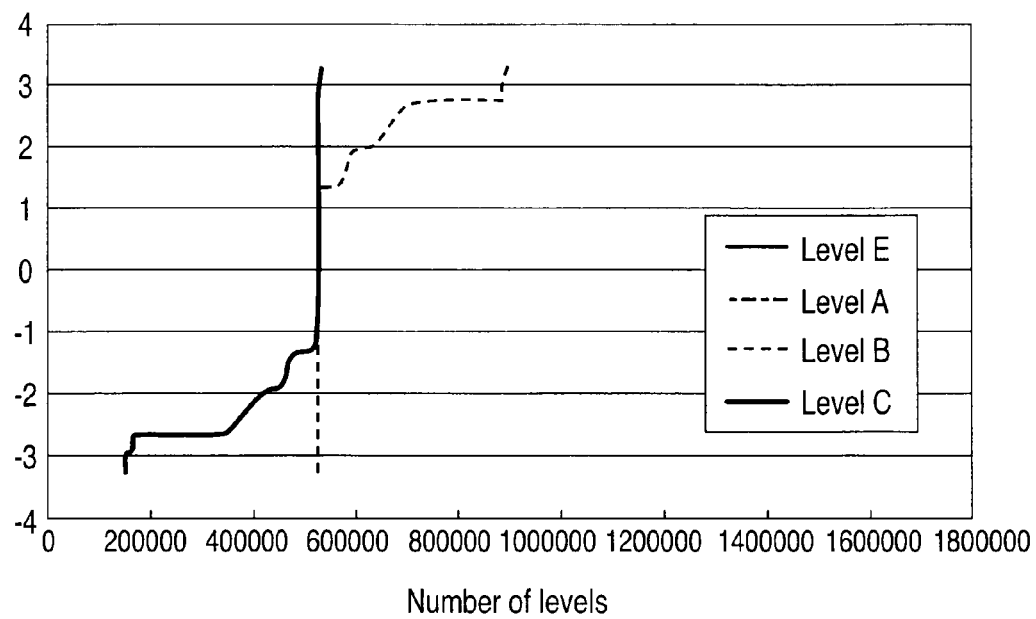
Figure 18C:
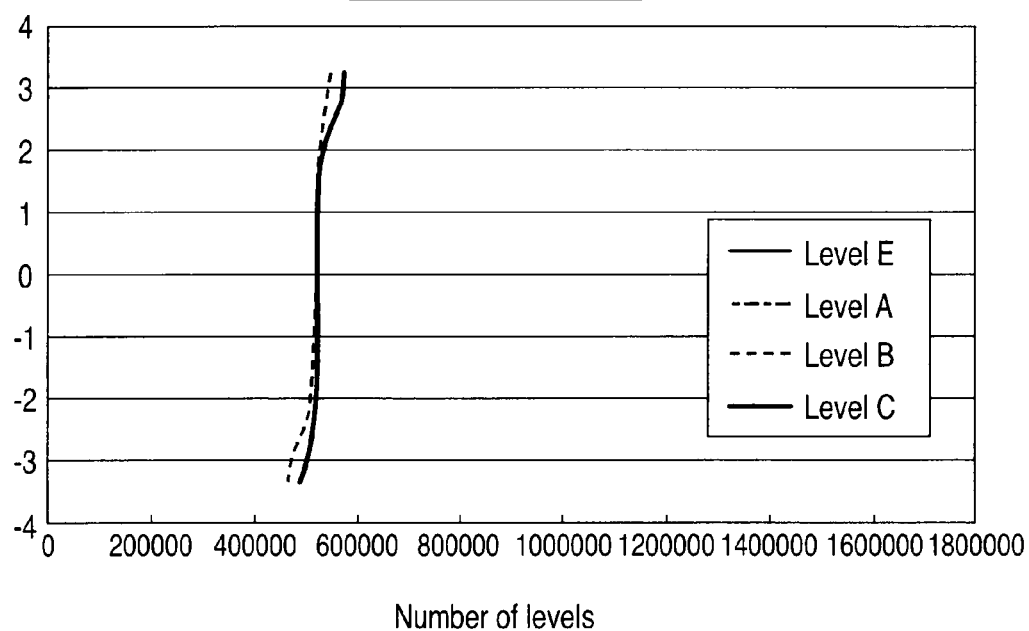
Figure 19A:
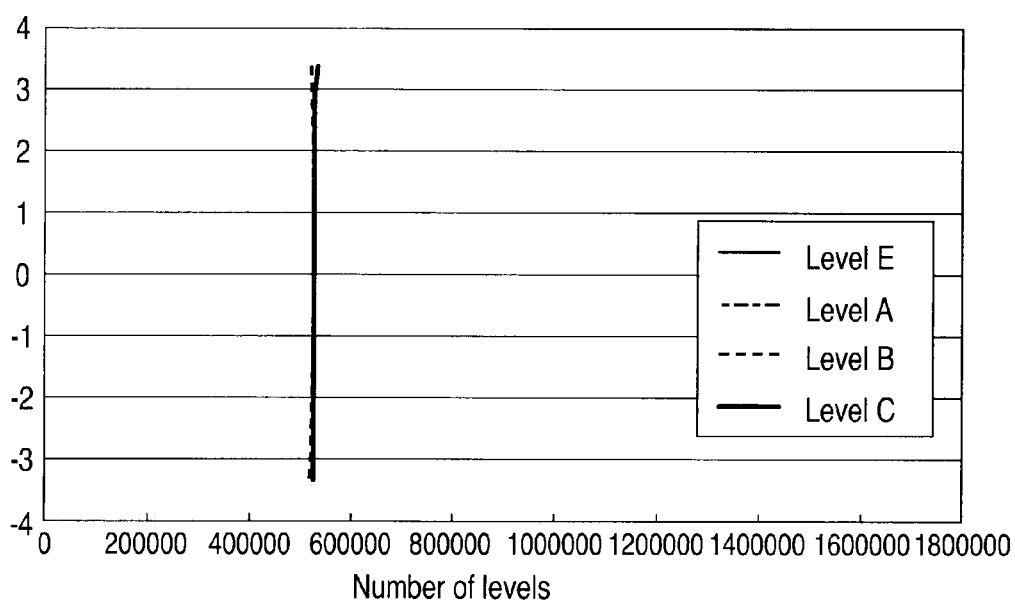
FIGS. 19A and 19B are views showing the results of simulation of the cell threshold level distributions of NAND flash memories of scrambling methods 1 and 2 according to the embodiment of the present invention.
Figure 19B:
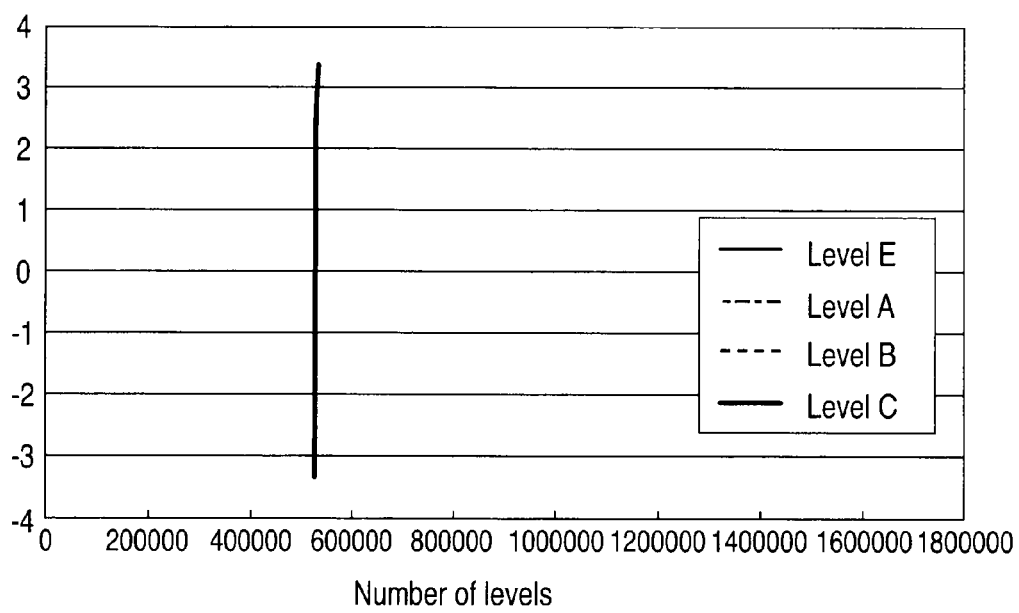

Comparative example 1 shown in FIG. 18A is the case where original data before random number generation was used. Comparative example 2 shown in FIG. 18B is the case where random numbers were generated by the M-sequence in only the column direction. Comparative example 3 shown in FIG. 18C is the case where random numbers were generated by the M-sequence in the column direction, and data was inverted for every four pages in the page direction. FIG. 19A shows scrambling method 1 described above. That is, FIG. 19A shows the case where randomization was performed by the M-sequence in the column direction by using the pseudo random number circuit initial value data shifted one bit for every page address. FIG. 19B shows scrambling method 2 described above. That is, FIG. 19B shows the case where pseudo random numbers were generated by the M-sequence in the column direction by using the pseudo random number circuit initial value shifted one bit for every page address, and the data was inverted in the page address direction in accordance with the page address. Compared to comparative examples 1 to 3 shown in FIGS. 18A to 18C, the uniformity of the threshold level distribution of each cell greatly improved in the cases shown in FIGS. 19A and 19B.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system comprising:
    a NAND flash memory including a memory block containing a plurality of pages; and
    a controller which controls write of data to the flash memory, and includes a scrambling circuit which converts the data into a pseudo random number,
    wherein the scrambling circuit includes
    an initial value generator which generates an initial value for every segment,
    an initial value shifter which shifts the initial value by N bits for every page address,
    a pseudo random number generator which generates a pseudo random number sequence by an M-sequence by using the initial value shifted N bits, and
    a random number adder which adds the pseudo random number sequence to the data.

2. The system according to claim 1, wherein the scrambling circuit further includes a determination circuit which determines whether an address designated by write of the data is a block as an object of pseudo random number generation.

3. The system according to claim 1, wherein the scrambling circuit generates the initial value shifted one bit in accordance with the page address.

4. The system according to claim 1, wherein the segment is a memory management unit of the controller and includes a data portion and a redundant portion.

5. The system according to claim 1, wherein the pseudo random number generator generates the pseudo random number sequence randomized in both a column direction and a page direction.

6. The system according to claim 1, wherein the initial value generated by the initial value generator is a value shifted a number of times calculated by dividing a random number generation period by the number of I/Os in the segment.

7. The system according to claim 6, wherein the number of times of shift is equal between the I/Os.

8. The system according to claim 6, wherein the number of times of shift changes from one I/O to another.

9. The system according to claim 1, wherein the scrambling circuit further includes a random number subtractor which performs subtraction on the data by using the same random number sequence as the pseudo random number sequence, and reads out the data.

10. The system according to claim 1, wherein the pseudo random number generator is a Fibonacci pseudo random number generator.

11. The system according to claim 10, wherein
    the pseudo random number generator comprises
    a plurality of first shift registers connected in series,
    a second shift register having output terminals respectively connected to the plurality of first shift registers, and
    a plurality of exclusive OR gates connected to output terminals of the plurality of first shift registers.

12. The system according to claim 1, wherein the scrambling circuit further includes a data inverter which regularly inverts or does not invert data of the pseudo random number sequence on the basis of the page address.

13. The system according to claim 12, wherein the scrambling circuit further includes a determination circuit which determines whether an address designated by write of the data is a block as an object of pseudo random number generation.

14. The system according to claim 12, wherein the scrambling circuit generates the initial value shifted one bit in accordance with the page address.

15. The system according to claim 12, wherein the segment is a memory management unit of the controller and includes a data portion and a redundant portion.

* * * * *